(12) United States Patent
Saeki

(10) Patent No.: US 7,808,035 B2
(45) Date of Patent: Oct. 5, 2010

(54) SEMICONDUCTOR MEMORY AND SEMICONDUCTOR DEVICE WITH NITRIDE MEMORY ELEMENTS

(75) Inventor: Katsutoshi Saeki, Miyagi (JP)

(73) Assignee: Oki Semiconductor Co., Ltd., Tokyo (JP)

(*) Notice: Subject to any disclaimer, the term of this patent is extended or adjusted under 35 U.S.C. 154(b) by 288 days.

(21) Appl. No.: 11/702,153

(22) Filed: Feb. 5, 2007

(65) Prior Publication Data

US 2007/0221981 A1 Sep. 27, 2007

(30) Foreign Application Priority Data

Mar. 14, 2006 (JP) .............................. 2006-069802

(51) Int. Cl.
*H01L 27/108* (2006.01)
(52) U.S. Cl. ................ 257/321; 257/314; 257/315; 257/316; 257/E29.129
(58) Field of Classification Search ................ 257/314, 257/315, 316, 321, E29.129
See application file for complete search history.

(56) References Cited

U.S. PATENT DOCUMENTS

| 5,969,383 | A | * | 10/1999 | Chang et al. | ................. 257/316 |
| 6,274,426 | B1 | * | 8/2001 | Lee et al. | ..................... 438/253 |
| 6,707,079 | B2 | * | 3/2004 | Satoh et al. | .................. 257/288 |
| 2002/0140043 | A1 | * | 10/2002 | Mitani et al. | ................. 257/410 |
| 2007/0161195 | A1 | * | 7/2007 | Lee et al. | ..................... 438/287 |

FOREIGN PATENT DOCUMENTS

| JP | 2004-056095 | 2/2004 |
| JP | 2004-343015 | 12/2004 |

* cited by examiner

*Primary Examiner*—Tan N Tran
(74) *Attorney, Agent, or Firm*—Rabin & Berdo, PC

(57) ABSTRACT

A semiconductor memory has a gate electrode and a pair of multilayer memory elements formed on side surfaces of the gate electrode. Each multilayer memory element includes, in sequence from the gate electrode outward, a first silicon oxide layer, a charge trapping silicon nitride layer, a second silicon oxide layer, all with L-shaped cross sections, and a protective silicon nitride layer with an approximately rectangular cross section seated in the L-shape of the second silicon oxide layer. The protective silicon nitride layer protects the charge trapping silicon nitride layer from etching damage during the formation of contact holes without adding to the area occupied by the memory cell.

16 Claims, 4 Drawing Sheets

SEMICONDUCTOR MEMORY AND SEMICONDUCTOR DEVICE WITH NITRIDE MEMORY ELEMENTS

BACKGROUND OF THE INVENTION

1. Field of the Invention

The present invention relates to a semiconductor memory or semiconductor device having nonvolatile memory cells with multilayer memory elements formed on both side surfaces of a transistor gate electrode.

2. Description of the Related Art

Memory cells with this structure are advantageous because they can store two bits of information per cell. Many semiconductor memories employing this structure use an oxide-nitride-oxide (ONO) multilayer memory element in which a silicon nitride charge trapping layer is sandwiched between silicon oxide insulating layers. Japanese Patent Application Publication No. 2004-56095 discloses a memory of this type, in which the gate electrode is flanked on both sides by L-shaped first silicon oxide insulating layers, the silicon nitride trapping layers are seated in these insulating layers, and second silicon oxide insulating layers cover both the trapping layers and the edges of the first insulating layers. Japanese Patent Application Publication No. 2004-343015 discloses a generally similar memory in which the silicon nitride trapping layers are also L-shaped, and the second silicon oxide insulating layers are seated in the trapping layers. These memories are programmed by hot electron injection from the channel beneath the gate into the trapping layer, the electrons passing through the first insulating layer.

In these memories, the transistor gates and their multilayer memory elements are covered by an interlayer dielectric film of silicon oxide. Contact holes are formed in the interlayer dielectric film by an anisotropic etching process to provide electrical access to the source and drain areas of the substrate on both sides of the gate. A problem is that if the contact holes are misaligned, the anisotropic etching process may etch through part of the multilayer memory elements, reducing or eliminating the region in which hot electron injection takes place, thus making it difficult or impossible to program the memory cells.

To avoid this reliability problem, it is necessary to allow a margin of space between the contact holes and the multilayer memory elements, but that is undesirable because it makes the memories larger and more expensive.

As an alternative structure, Japanese Patent Application Publication No. 2004-343015 also discloses a memory in which the multilayer memory element has an inverted U-shape that covers the top and sides of the gate electrode. The U-shaped memory element is covered by a further outer layer of silicon nitride seventy to two hundred nanometers thick. The anisotropic etching process that forms the contact holes is highly selective, etching silicon nitride much more slowly than silicon oxide, so even if the contact holes are misaligned, the etching process does not penetrate through the thick outer silicon nitride layer and the memory elements remain undamaged.

Although this structure eliminates the need for an alignment margin, it has other disadvantages, one being that the thick outer silicon nitride layer covering the multilayer memory element, which is itself comparatively thick, limits the possible reduction in memory cell size.

SUMMARY OF THE INVENTION

An object of the present invention is to provide a small and reliable two-bit memory cell, a semiconductor memory including such memory cells, and a semiconductor device including such a semiconductor memory.

The invented semiconductor memory has a semiconductor substrate covered by a silicon oxide interlayer dielectric film. Each memory cell has a gate electrode, a gate insulation film interposed between the gate electrode and the surface of the semiconductor substrate, a pair of highly doped diffusion regions formed in the surface of the semiconductor substrate on opposite sides of the gate electrode, and a pair of multilayer memory elements formed on the side surfaces of the gate electrode.

Each multilayer memory element comprises a first silicon oxide layer extending from substantially the top to the bottom of one side surface of the gate electrode and then outward onto one of the highly doped diffusion regions, a charge trapping nitride layer formed on the first silicon oxide layer, a second silicon oxide layer formed on the charge trapping nitride layer, and a protective silicon nitride layer formed on the second silicon oxide layer.

In this structure, the first and second silicon oxide layers and the charge trapping nitride layer may have L-shaped cross sections while the protective silicon nitride layer has a substantially rectangular cross section and with two sides resting on the second silicon oxide layer. In this configuration, when contact holes are formed in the interlayer dielectric film to provide electrical access to the highly-doped regions of the substrate, the protective silicon nitride layer protects the other parts of the multilayer memory element from etching damage without increasing the area occupied by the memory cell.

DETAILED DESCRIPTION OF THE INVENTION

Figure 1:
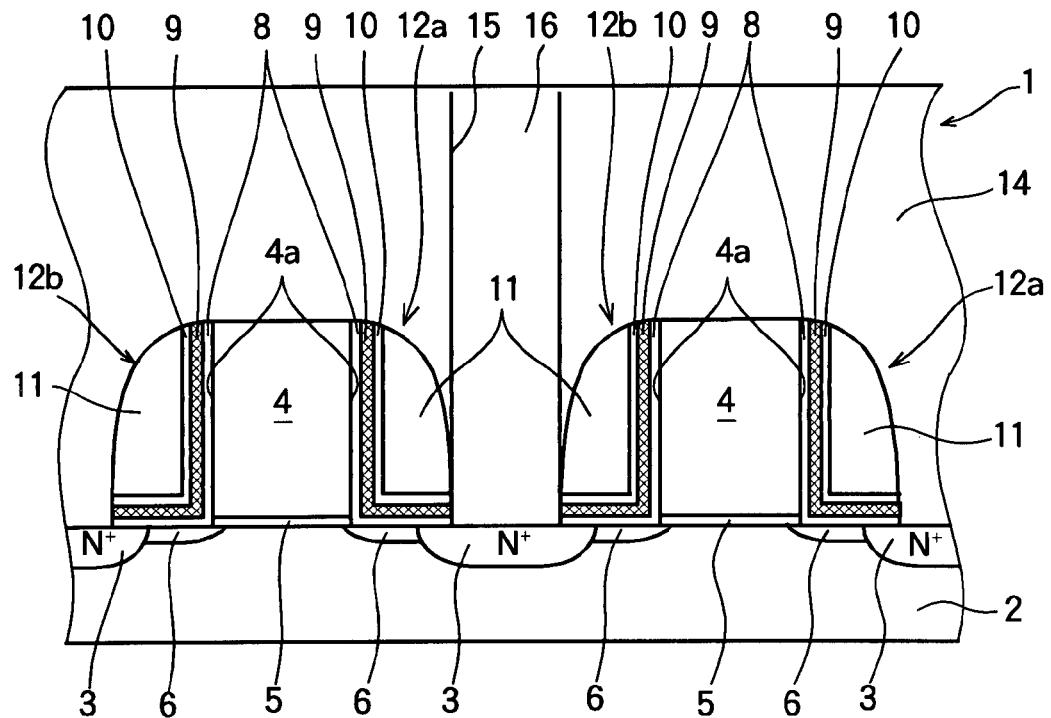
FIG. 1 is a sectional view of memory cells in a semiconductor device according to a first embodiment of the invention.

Semiconductor devices including memory cells embodying the present invention will now be described with reference to the attached drawings, in which like elements are indicated by like reference characters.

First Embodiment

Referring to FIG. 1, the semiconductor device 1 in the first embodiment includes a plurality of memory cells formed on a semiconductor substrate 2, which is a monocrystalline silicon (Si) substrate doped at a comparatively low concentration with a p-type impurity. Each memory cell is generally similar in structure to a metal-oxide-semiconductor field-effect transistor (MOSFET).

As the sources and drains of the MOSFET structure, a plurality of highly-doped regions 3 are formed in a surface layer of the semiconductor substrate 2. The highly-doped regions 3 are doped at a comparatively high concentration with an n-type impurity.

As the gates of the MOSFET structure, a plurality of gate electrodes 4 are formed on the semiconductor substrate 2 between the highly-doped regions 3. The gate electrodes 4 are formed from polysilicon and are separated from the semiconductor substrate 2 by a gate insulation film 5 of silicon oxide ($SiO_2$). Each gate electrode 4 is centered between a mutually adjacent pair of highly-doped regions 3.

The part of the surface layer of the semiconductor substrate 2 between the highly-doped regions 3 and the gate electrodes 4 is occupied by lightly doped regions 6 doped at a comparatively low concentration with an n-type impurity. The edges of the lightly doped regions 6 extend beneath the gate electrodes 4. Lightly doped regions 6 of this type are generally referred to as lightly doped drains (LDD), regardless of whether they are disposed on the source side or the drain side of the gate.

A first silicon oxide layer 8 is disposed on each side surface 4a of the gate electrode 4 in each memory cell. The first silicon oxide layer 8 has an L shape, extending from substantially the top to the bottom of the side surface 4a and then extending outward from the side surface 4a to the adjacent highly-doped region 3. The first silicon oxide layers 8 are comparatively thin, with thicknesses in the range from three to twenty nanometers (3 to 20 nm).

A charge trapping nitride layer 9 (indicated by hatching) having a similar L shape is disposed on the first silicon oxide layer 8. The charge trapping nitride layer 9 is made of silicon nitride (SiN) and is also comparatively thin, with a thickness in the range of 2 to 15 nm. The function of the charge trapping nitride layer 9 is to store data by trapping injected electrons.

A second silicon oxide layer 10 also having an L shape and a thickness in the range of 3 to 20 nm is disposed on the charge trapping nitride layer 9. The second silicon oxide layer 10 functions as an electron barrier, preventing the electrons trapped in the charge trapping nitride layer 9 from migrating elsewhere.

A protective silicon nitride layer 11 having a substantially rectangular shape is seated in the 'L' of the second silicon oxide layer 10. The protective silicon nitride layer 11 is comparatively thick, its thickness being in the range from 10 to 200 nm. The function of the protective silicon nitride layer 11 is to protect the charge trapping nitride layer 9 during an anisotropic contact hole etching process, described later. The protective silicon nitride layer 11 is not perfectly rectangular because one of its upper corners becomes rounded during another anisotropic etching process that exposes the top surfaces of the gate electrodes, so that two of its sides approximate an arc of a circle, ellipse, or parabola.

The silicon oxide and nitride layers 8, 9, 10, 11 forming multilayer memory elements 12a, 12b having an oxide-nitride-oxide-nitride (ONON) structure. Both nitride layers 9, 11 comprise silicon nitride (SiN); both oxide layers 8, 10 comprise silicon dioxide ($SiO_2$). When the memory is programmed, hot electrons injected from the channel in the semiconductor substrate 2 below the gate electrode 4 are trapped in the charge trapping nitride layer 9, or at the interfaces between the charge trapping nitride layer 9 and one or both of the first and second silicon oxide layers 8, 10. In particular, the electrons are trapped in the lower part of the charge trapping nitride layer 9, so that their electric field alters the resistance of the lightly doped region 6. It is this property that enables the data represented by the trapped electrons to be read. The trapped electrons remain trapped even when the memory is powered off, making the memory nonvolatile.

The multilayer memory elements 12a, 12b, gate electrodes 4, and semiconductor substrate 2 are covered by an interlayer dielectric film 14 of silicon oxide, in which contact holes are formed to provide electrical access to the highly-doped regions 3. The contact hole 15 shown in FIG. 1 occupies the space between a pair of mutually adjacent multilayer memory elements 12a and 12b. The contact hole 15 is filled with a conductive material such as tungsten (W) that forms a contact plug 16 electrically connecting the highly-doped region 3 below to a wiring pattern (not shown) above.

Next a series of processes (P1-P6) for fabricating the structure in FIG. 1 will be described.

The procedure begins with an isolation process (P1) such as local oxidation of silicon (LOCOS) or shallow trench isolation (STI) that divides the surface layer of the semiconductor substrate 2 into active regions separated by isolation regions. The memory cells in FIG. 1 and other circuit elements (not shown) will be formed in the active regions. The isolation regions are, for example, thick silicon oxide regions that electrically isolate the active regions. In FIG. 1 the isolation regions (not shown) extend parallel to the surface of the drawing sheet in front of and behind the memory cells.

The next process (P2) forms a thin film of silicon oxide on the surface of the active regions of the semiconductor substrate 2 by, for example, thermal oxidation, deposits a layer of polysilicon on the silicon oxide film by chemical vapor deposition (CVD), coats the polysilicon layer with a resist layer, and patterns the resist layer by photolithography to form a mask defining the shapes of the gate electrodes 4. The material not covered by the mask is then etched down to the surface of the semiconductor substrate 2 by dry etching, for example, leaving the gate electrodes 4 and gate insulation film 5.

The next process (P3) removes the mask and implants ions of an n-type impurity at a comparatively low concentration into the surface layer of the semiconductor substrate 2 between the gate electrodes 4, forming the lightly doped regions 6. At this point each lightly doped region 6 extends from one gate electrode 4 to an adjacent gate electrode 4. Next, a first silicon oxide layer, a first silicon nitride layer, a second silicon oxide layer, and a second silicon nitride layer are formed one atop another in succession on the surface and sides of the gate electrodes 4 and elsewhere by CVD. These layers are then etched anisotropically until the tops of the gate electrodes 4 are exposed. Parts of the layers are left attached to the sides of the gate electrodes 4, forming the ONON structure of the multilayer memory elements 12a, 12b, in which the first silicon nitride layer becomes the charge trapping nitride layer 9. Between the multilayer memory elements 12a and 12b, the etching process proceeds down to and exposes the surface of the semiconductor substrate 2.

The layers constituting the multilayer memory elements 12a, 12b need not all be formed by CVD. The first silicon oxide layer may be formed by thermal oxidation. If the first silicon nitride layer is deposited with a little extra thickness, the second silicon oxide layer may also be formed by thermal oxidation.

In the next process (P4), ions of an n-type impurity are implanted at a comparatively high concentration into the surface of the semiconductor substrate 2 that is exposed between the multilayer memory elements 12a, 12b on the side surfaces 4a of the gate electrodes 4, forming the highly-doped regions 3. The highly-doped regions 3 are self-aligned by the multilayer memory elements 12a, 12b. The implantation process includes an annealing step that spreads the edges of the highly-doped regions 3 so that they extend partly under the multilayer memory elements 12a, 12b. Similarly, the edges of the lightly doped regions 6 extend partly under the gate electrodes 4.

Figure 2:
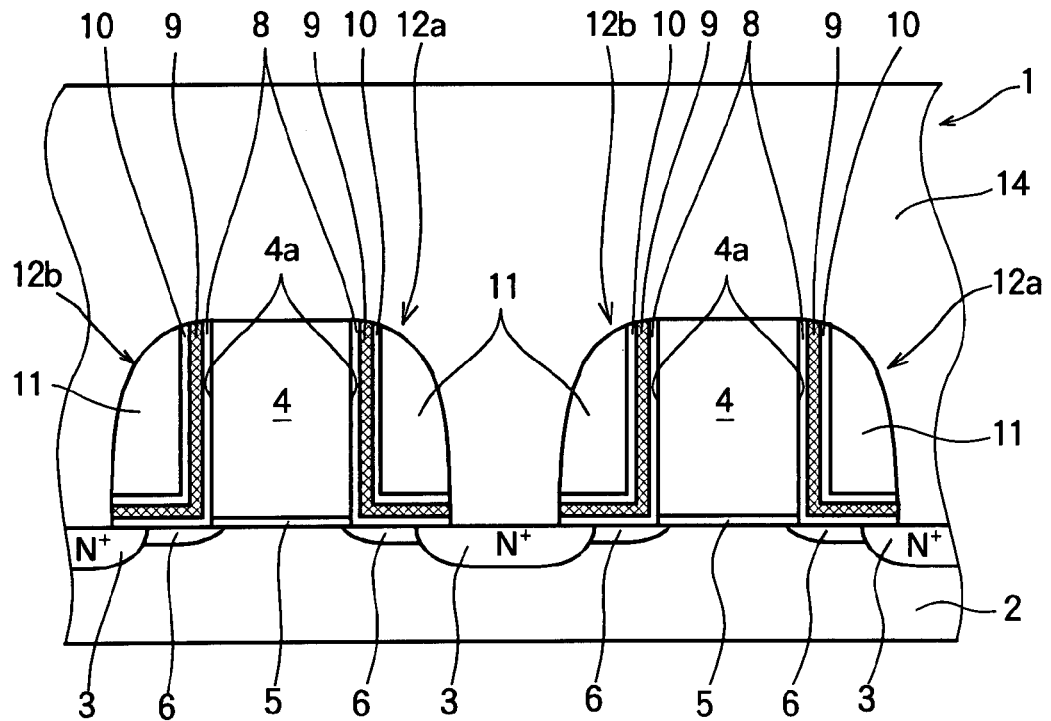
FIG. 2 is a sectional view showing a stage in the fabrication of the semiconductor device in FIG. 1 before the formation of contact holes.

In the next process (P5), a thick silicon oxide layer is deposited on the entire surface of the semiconductor substrate 2, including the multilayer memory elements 12a, 12b and gate electrodes 4, by CVD, and the surface of this silicon oxide layer is planarized to form the interlayer dielectric film 14. FIG. 2 shows the memory cells at the completion of this process.

In the next process (P6), the interlayer dielectric film 14 is coated with a resist layer (not shown), which is patterned by photolithography to form openings nominally centered between the gate electrodes 4, and the interlayer dielectric film 14 is anisotropically etched through these openings to create the contact holes 15. Etching conditions with a high $SiO_2$/SiN selectivity ratio are used, so that even if the holes in the resist mask are not perfectly aligned and part of the protective silicon nitride layer 11 is etched, it is etched much more slowly than the silicon-oxide interlayer dielectric film 14. The etching process is stopped when it reaches the highly-doped regions 3 in the semiconductor substrate 2; then the resist mask is removed and the contact holes 15 are filled with a conductive material deposited by CVD, for example, to form the contact plugs 16, completing the structure shown in FIG. 1.

In a further process (not shown) a wiring pattern is formed on the interlayer dielectric film 14, making electrical contact with the contact plugs 16, and further interlayer dielectric films, wiring layers, etc. are formed as necessary.

The data retention characteristics of memory cells fabricated as described above were evaluated under accelerated life testing conditions at an ambient temperature of 250° C. The results are indicated by points marked with triangles in FIG. 3. The vertical axis represents change in current flow between the source and drain (ΔIds) of a memory cell over time in microamperes; the horizontal axis indicates elapsed time in hours. For comparison, FIG. 3 also shows results of similar tests of memory cells having a conventional ONO structure of the general type shown in FIG. 18 in Japanese Patent Application Publication No. 2004-343015; these memory cells were formed by increasing the thickness of the second silicon oxide layer 10 and omitting the protective silicon nitride layer 11 in the process (P3) described above; the test results are indicated by points marked with diamonds. For further comparison, memory cells having an ON structure were fabricated by increasing the thickness of the charge trapping nitride layer 9 and omitting both the second silicon oxide layer 10 and protective silicon nitride layer 11 in the above process, and these cells were also tested, giving the results indicated by squares in FIG. 3.

Figure 3:
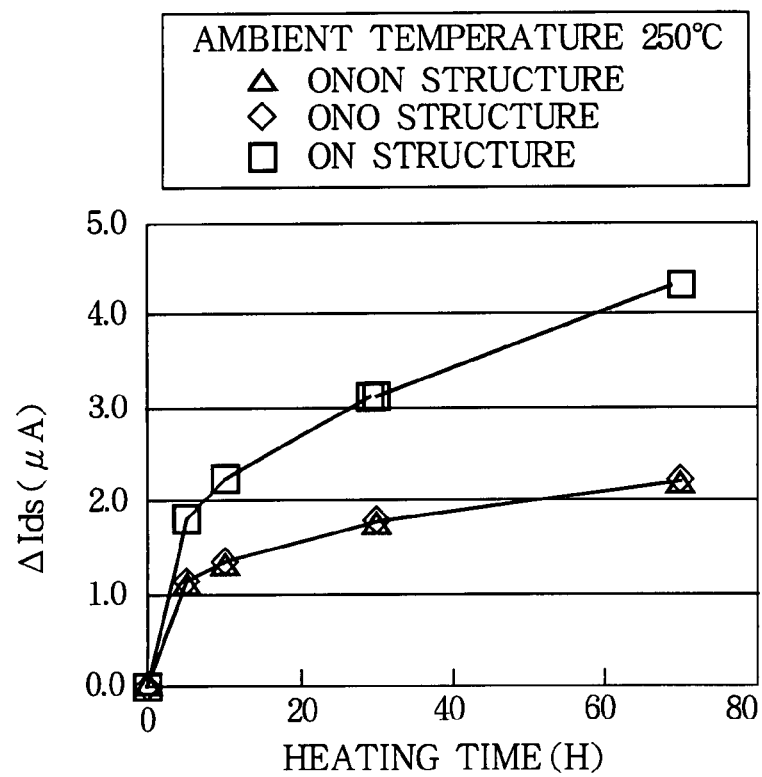
FIG. 3 is a graph showing results of accelerated life tests of the memory cells in FIG. 1 and other types of semiconductor memory cells.

As FIG. 3 shows, the novel ONON structure performs just as well as the conventional ONO structure, despite the presence of the protective silicon nitride layer 11 near the charge trapping nitride layer 9. The ON structure performs less well, allowing approximately twice as much source-drain current to flow, indicating that electrons excited by thermal energy were migrating from the lower part toward the upper part of the charge trapping nitride layer.

The substantially identical performance of the novel ONON structure and the conventional ONO structure shows that even a thin second silicon oxide layer 10 can suppress the unwanted migration of electrons. That is, even a thin second silicon oxide layer 10 can act as an electron barrier to prevent the escape of stored charge under conditions of high ambient temperature, or high internal temperature caused by the operation of other circuit elements in the device. The invented semiconductor memory can therefore be used under the same conditions as a conventional memory with an ONO structure.

The results in FIG. 3 also indicate that the thinness of the charge trapping nitride layer 9 is a factor in preventing unwanted electron migration.

Figure 4:
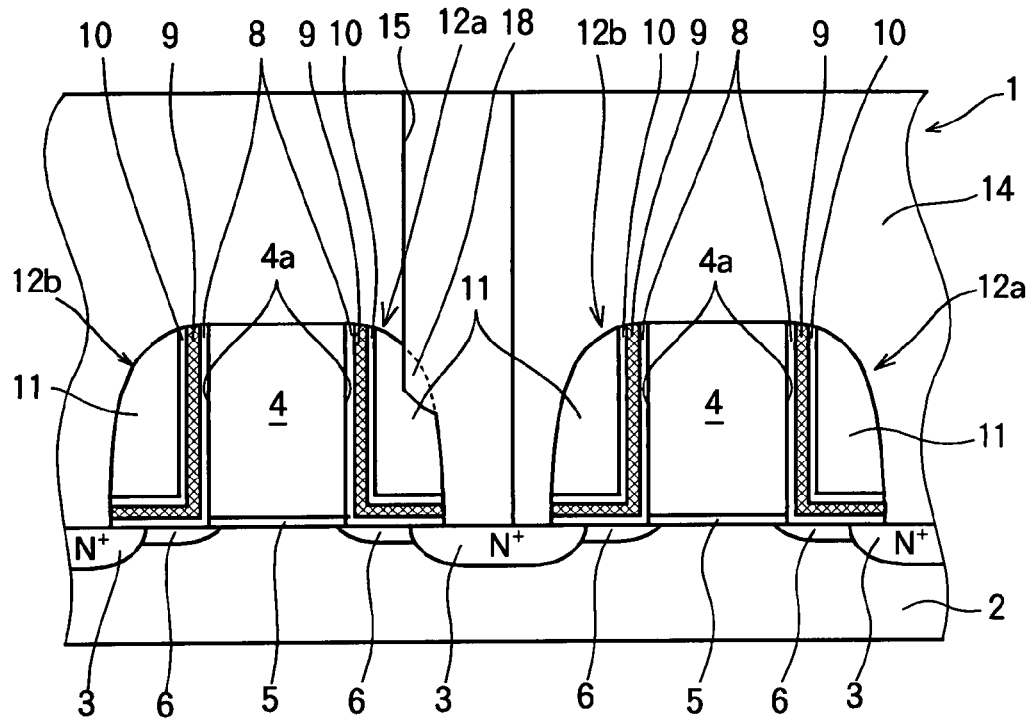
FIG. 4 is a sectional view illustrating the memory cells in FIG. 1 with a misaligned contact hole.

FIG. 4 shows an example of the memory cells in the first embodiment in which the contact hole 15 is imperfectly aligned, being shifted to the left in the drawing. As a result, the process (P6) that etches the contact holes also etches part of the protective silicon nitride layer 11 in multilayer memory element 12a. Because of the high $SiO_2$/SiN selectivity of the etching process, however, the contact hole etching process is completed before it reaches the charge trapping nitride layer 9. In particular, the lowermost part of the charge trapping nitride layer 9, into which electrons are injected from the channel, remains intact, so the programming and erasing performance of the memory cell is unimpaired.

The protection provided by the protective silicon nitride layer 11 provides an increased alignment tolerance for the contact holes 15. It also means that when the spacing between gate electrodes 4 is determined, it is only necessary to provide enough space to assure adequate electrical contact between the contact plugs 16 and the highly-doped regions 3, allowing for alignment error and variation in the cross-sectional shapes of the contact plugs 16; it is not necessary to allow further space to prevent etching damage to the charge trapping nitride layers 9. Moreover, the silicon nitride layers 11 that protect the charge trapping nitride layers 9 from etching damage do not add to the area occupied by the memory cell, since they are seated within the L-shape of the charge trapping nitride layer 9 and the silicon oxide layers 8, 10. Consequently, a high-density memory can be fabricated with high reliability.

A semiconductor device including the memory cells of the first embodiment will normally also include peripheral circuits or logic circuits including MOSFETs. In the first embodiment, these MOSFETs have substantially the same structure as in the memory cells.

Figure 5:
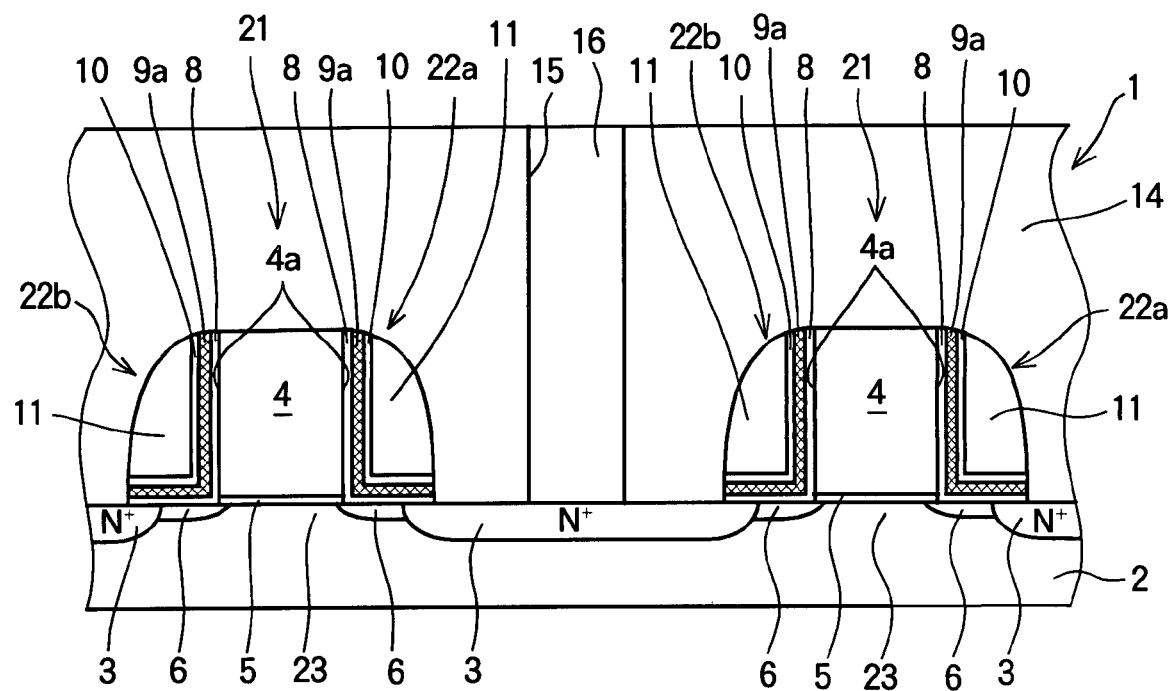
FIG. 5 is a sectional view of a pair of transistors in the semiconductor device in the first embodiment.

FIG. 5 shows a pair of n-channel MOSFETs 21 in the peripheral or logic circuits of the semiconductor device. The highly-doped regions 3 and lightly doped regions 6 are again doped with an n-type impurity. Depending on the circuit layout, the length of the highly-doped regions 3 may be increased, as shown, but otherwise, the structure is the same as in FIG. 1, including the same semiconductor substrate 2, gate electrodes 4, gate insulation films 5, interlayer dielectric film 14, contact holes 15, and contact plugs 16. The sidewalls 22a, 22b on the side surfaces 4a of the gate electrodes 4 are identical to the multilayer memory elements 12a, 12b in FIG. 1, but the first silicon nitride layer functions as a silicon nitride insulating film 9a instead of a charge trapping nitride layer. The reason is that the device is not operated in such a way as to inject significant numbers of hot electrons into the silicon nitride insulating film 9a. The first silicon oxide layer 8, silicon nitride insulating film 9a, second silicon oxide layer 10, and protective silicon nitride layer 11 are, accordingly, all insulating layers, and the sidewalls 22a, 22b function to align the highly-doped regions 3 but not to store data.

The MOSFETs 21 in FIG. 5 operate in the conventional way, current flow through the channel 23 being controlled by the voltage applied the gate electrode 4. The lightly doped regions 6 function as LDD regions.

P-channel MOSFETs in the peripheral or logic circuits have a similar structure, except that they are formed in n-wells in the semiconductor substrate 2 and the highly-doped regions 3 and lightly doped regions 6 are doped with a p-type impurity.

The identical MOSFET structure used both in the memory cells and in peripheral or logic circuits simplifies the fabrication of the semiconductor device in the first embodiment. In particular, n-channel MOSFETs can be formed by exactly the same processes (P1-P6).

Second Embodiment

Figure 6:
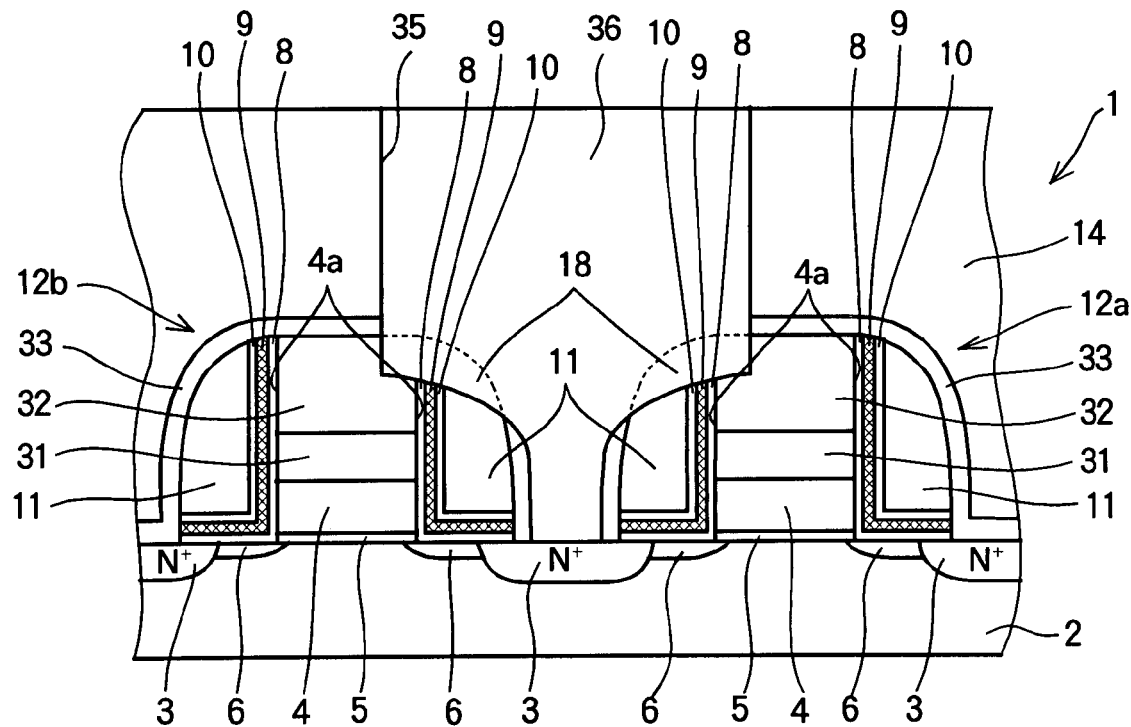
FIG. 6 is a sectional view of a pair of memory cells in a semiconductor device according to a second embodiment.

The second embodiment differs from the first embodiment in that the memory cells have self-aligned contact holes. Referring to FIG. 6, the second embodiment is a semiconductor device 1 with memory cells having the same semiconductor substrate 2, highly-doped regions 3, gate insulation films 5, lightly doped regions 6, and interlayer dielectric film 14 as in the first embodiment and the same ONON structure comprising a first silicon oxide layer 8, a charge trapping nitride layer 9, a second silicon oxide layer 10, and a protective silicon nitride layer 11, but differing in respect to the gate electrodes and contact holes and plugs.

The gate structure in the second embodiment includes a polysilicon gate electrode 4 overlain by a silicide film 31, which is a thin film of an alloy of silicon and a metal (such as tungsten) having a comparatively high-melting point. The silicide film 31 reduces the electrical resistance of the gate. The silicide film 31 is covered by a nitride hard mask film 32 of silicon nitride with a thickness in the range from 50 to 300 nm, which protects the gate during self-aligned etching of the contact holes. Further protection is provided by a nitride stopper film 33, which covers the top and sides of the gate structure, including the multilayer memory elements 12a, 12b formed on the side surface 4a of the gates, and also covers the surface of the semiconductor substrate 2, except at the contact holes. The thickness of the nitride stopper film 33 is in the range from 10 to 40 nm.

The contact holes 35 in the memory cells are nominally centered between adjacent gates, as in the first embodiment, but they are larger, and cut into the nitride hard mask film 32 in the gates on one or both sides. They then become more narrow, approximately following the curved shape of the nitride stopper film 33, and finally descend along with the nitride stopper film 33 to the surface of the highly-doped regions 3 in the semiconductor substrate 2. The contact holes 35 are filled with contact plugs 36 that electrically connect the highly-doped regions 3 to wiring (not shown) formed above the interlayer dielectric film 14, as in the first embodiment.

Next a procedure for fabricating the memory cells in the second embodiment will be described. The procedure begins with the first process (P1) described in the first embodiment.

In the next process (PA2), the gate insulation film 5 and a layer of polysilicon are formed as in the first embodiment, then a comparatively thin layer of silicide and a thicker layer of silicon nitride are deposited by CVD. These layers are patterned by photolithography and etching as described in the first embodiment to form the gate electrode 4, gate insulation film 5, silicide film 31, and nitride hard mask film 32 constituting the gates.

In the next process (PA3), the etching mask used in process PA2 is removed, the lightly doped regions 6 are formed by ion implantation, and the multilayer memory elements 12a, 12b comprising the first silicon oxide layer 8, charge trapping nitride layer 9, second silicon oxide layer 10, and protective silicon nitride layer 11 are formed substantially as described in the first embodiment, except that in the upper regions of the gates, the first silicon oxide layer 8 is deposited on the sides of the silicide film 31 and nitride hard mask film 32.

In the next process (PA4), the highly-doped regions 3 are formed by ion implantation as described in the first embodiment; then a layer of silicon nitride is deposited by CVD on all exposed surfaces, including the top of the nitride hard mask film 32 and the multilayer memory elements 12a, 12b, to form the nitride stopper film 33.

Figure 7:
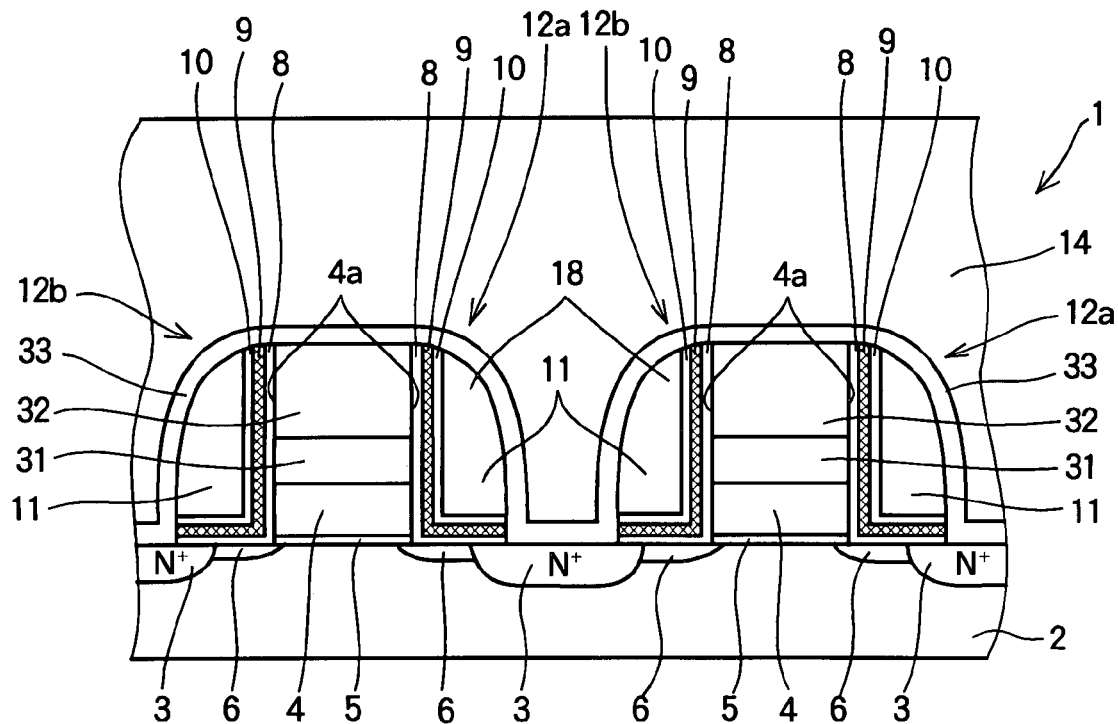
FIG. 7 is a sectional view showing a stage in the fabrication of the semiconductor device in FIG. 6 before the formation of contact holes.

In the next process (PA5), the interlayer dielectric film 14 is formed substantially as in the first embodiment, except that it is formed on the nitride stopper film 33. FIG. 7 shows the device at the conclusion of this process.

Figure 8:
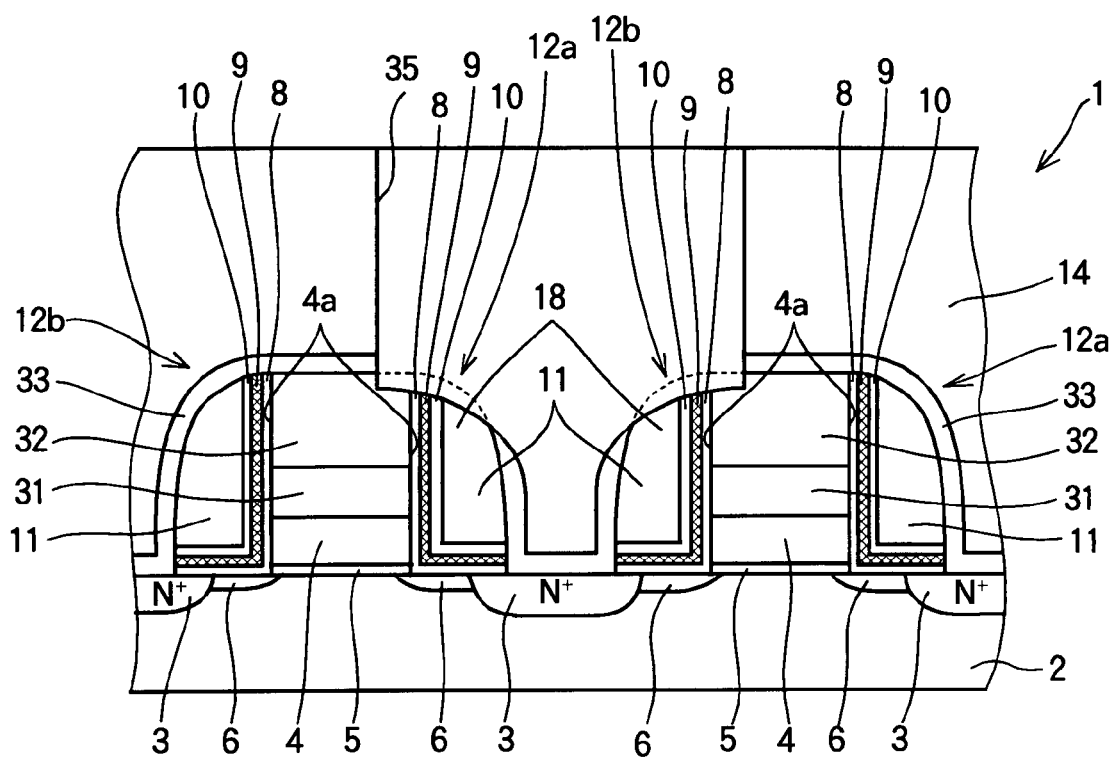
FIG. 8 is a sectional view showing a stage in the fabrication of the semiconductor device in FIG. 6 during the formation of contact holes.

In the next process (PA6), the interlayer dielectric film 14 is coated with a resist layer, which is then patterned by photolithography to form openings nominally centered between the gate electrodes 4, but wide enough to extend (if accurately centered) over part of the nitride hard mask film 32 in each gate. The interlayer dielectric film 14 is then anisotropically etched through these openings as in the first embodiment, using etching conditions with a high $SiO_2/SiN$ selectivity ratio. The etching time is controlled by detecting the nitride hard mask film 32 and stopping the etch a predetermined time after the nitride hard mask film 32 is exposed. The predetermined time is calculated from the known height of the nitride hard mask film 32 above the surface of the semiconductor substrate 2 and the known $SiO_2$ etching rate so that the etch stops at the surface of the nitride stopper film 33 in the areas between the multilayer memory elements 12a, 12b. For each contact hole, this etching process removes not only $SiO_2$ from the interlayer dielectric film 14, but also part of the nitride hard mask film 32 from the adjacent gates, and some of the top part of each adjacent multilayer memory element 12a, 12b. FIG. 8 shows the device at the end of this stage, using dotted lines to indicate the removed part 18 of the nitride hard mask film 32 and multilayer memory elements 12a, 12b.

The next process (PA7) is another anisotropic etching process that uses the same resist mask as in the preceding process (PA6) but has different etching conditions, chosen to etch SiN more rapidly than $SiO_2$. This etch removes the thin layer of SiN forming the nitride stopper film 33 at the bottom of each contact hole, exposing the surface of the highly-doped region 3. The etching time is controlled according to the SiN etching rate and the known thickness of the nitride stopper film 33. Similar thicknesses of material are also removed from the nitride hard mask film 32 and multilayer memory elements 12a, 12b, enlarging the removed parts 18 so that they assume the size indicated in FIG. 6. Next the resist mask is removed and the contact holes 35 are filled with a conductive material deposited by sputtering, for example, to form the contact plugs 36.

A wiring pattern (not shown) is then formed on the interlayer dielectric film 14, making electrical contact with the contact plugs 36, and further interlayer dielectric films, wiring layers, etc. are formed as necessary to complete the semiconductor device 1.

While the memory cells are being formed, other MOSFETs may be formed by the same processes in peripheral or logic circuits in the same device, as explained in the first embodiment.

Although the nitride hard mask film 32 is partly removed by the anisotropic etching in the contact hole formation processes (PA6, PA7), the nitride hard mask film 32 and nitride stopper film 33 are thick enough to assure that these etching processes do not expose any part of the silicide film 31 and gate electrode 4 in the gate structure or create any short circuits between these gate layers and the contact plugs 36.

As in the first embodiment, the protective silicon nitride layer 11 protects the lower parts of the charge trapping nitride layer 9. In addition, the thinness (3-20 nm) of the first and second silicon dioxide layers 8, 10 creates an etch-stopping effect that assures that they are not etched deeply even though the top ends of these layers are exposed during the SiO$_2$ etching process (PA6). The thinness (2-15 nm) of the charge trapping nitride layer 9 creates a similar etch-stopping effect that assures that the charge trapping nitride layer 9 is not etched deeply even though its top end is exposed during the SiN etching process (PA7). Programming, erasing, and data storage performance of the memory cells therefore remain unimpaired.

An advantage of the second embodiment is that even considerable misalignment of the contact holes 35 can be tolerated without diminishing the area of contact between the contact plugs 36 and the highly-doped regions 3. This makes it possible to reduce the spacing between memory cells and the cost of the fabrication process, resulting in increased memory capacity and a smaller, denser, and less expensive semiconductor device.

Another advantage of the second embodiment is that the nitride stopper film 33 prevents the isolation regions formed in the initial process (P1) from being etched during the SiO$_2$ etching process (PA6). Since the isolation regions are silicon oxide regions, they also remain substantially unetched during the SiN etching process (PA7). Contact plugs can therefore be used to interconnect circuit elements in different active regions.

The invention is not limited to the preceding embodiments. For example, the semiconductor substrates 2 in FIGS. 1 and 6 may be doped with an n-type impurity and the highly-doped regions 3 and lightly doped regions 6 may be doped with a p-type impurity.

The ONON structure of the multilayer memory elements in the preceding embodiments may also be altered, to an ONONON structure, for example. Any number of silicon oxide and silicon nitride layers may be formed on the charge trapping nitride layer 9, provided that the uppermost layer is a silicon nitride layer.

The data stored in the memory cells may be read by detecting changes in the threshold voltages of the memory cells, instead of detecting changes in the resistance of the lightly doped regions 6.

Those skilled in the art will recognize that further variations are possible within the scope of the invention, which is defined in the appended claims.

What is claimed is:

1. A semiconductor memory having a semiconductor substrate with a surface layer covered by an interlayer dielectric film of silicon oxide and a plurality of memory cells formed on the surface layer within the interlayer dielectric film, each memory cell including a gate electrode with a pair of side surfaces, a gate insulation film interposed between the gate electrode and the surface layer of the semiconductor substrate, a pair of highly doped diffusion regions formed in the surface layer of the semiconductor substrate on both sides of the gate electrode, and a pair of multilayer memory elements formed on the side surfaces of the gate electrode, the multilayer memory elements extending onto the highly doped diffusion regions of the semiconductor substrate, each multilayer memory element comprising:

a first silicon oxide layer formed on one of the side surfaces of the gate electrode, extending to a bottom of said one of the side surfaces and onto one of the highly doped diffusion regions;

a charge trapping nitride layer formed on the first silicon oxide layer;

a second silicon oxide layer formed on the charge storage nitride layer;

a protective silicon nitride layer formed directly on the second silicon oxide layer, so as to touch the second silicon oxide layer;

a hard mask silicon nitride layer disposed on the gate electrode; and a silicon nitride stopper film disposed between the hard mask silicon nitride layer and the interlayer dielectric film so as to touch the hard mask silicon nitride layer, and being disposed between the multilayer memory elements and the interlayer dielectric film.

2. The semiconductor memory of claim 1, wherein the first silicon oxide layer, the charge trapping nitride layer, and the second silicon oxide layer have L-shaped cross sections.

3. The semiconductor memory of claim 1, wherein the first silicon oxide layer has a thickness of at most twenty nanometers.

4. The semiconductor memory of claim 3, wherein the first silicon oxide layer has a thickness of at least three nanometers.

5. The semiconductor memory of claim 1, wherein the charge trapping nitride layer has a thickness of at most fifteen nanometers.

6. The semiconductor memory of claim 5, wherein the charge trapping nitride layer has a thickness of at least two nanometers.

7. The semiconductor memory of claim 1, wherein the second silicon oxide layer has a thickness of at most twenty nanometers.

8. The semiconductor memory of claim 7, wherein the second silicon oxide layer has a thickness of at least three nanometers.

9. The semiconductor memory of claim 1, wherein the protective silicon nitride layer has a thickness of at most two hundred nanometers.

10. The semiconductor memory of claim 9, wherein the protective silicon nitride layer has a thickness of at least ten nanometers.

11. The semiconductor memory of claim 1, wherein the silicon nitride stopper film has a thickness of at most forty nanometers.

12. The semiconductor memory of claim 11, wherein the silicon nitride stopper film has a thickness of at least ten nanometers.

13. The semiconductor memory of claim 1, further comprising a contact plug extending through the interlayer dielectric film onto one of the highly doped diffusion regions.

14. The semiconductor memory of claim 13, wherein the contact plug also extends partly onto the hard mask silicon nitride layer of one of the memory cells.

15. The semiconductor memory of claim 1, each said memory cell further comprising a pair of lightly doped diffusion regions formed in the surface layer of the semiconductor substrate, extending from the highly doped diffusion regions, disposed partly beneath respective multilayer memory elements and partly beneath the gate electrode.

16. A semiconductor device including the semiconductor memory of claim 1 and a metal oxide semiconductor field effect transistor (MOSFET), the MOSFET having a gate electrode and highly doped diffusion regions formed in the surface layer of the semiconductor substrate on both sides of the gate electrode, wherein the MOSFET includes a pair of sidewalls identical in structure to the multilayer memory elements of the memory cells.

* * * * *